United States Patent
Sun

(10) Patent No.: US 7,241,650 B2
(45) Date of Patent: Jul. 10, 2007

(54) METHOD OF MANUFACTURING A POLYSILICON LAYER AND A MASK USED THEREIN

(75) Inventor: Ming-Wei Sun, Kaohsiung (TW)

(73) Assignee: AU Optronics Corp., Hsinchu (TW)

( * ) Notice: Subject to any disclaimer, the term of this patent is extended or adjusted under 35 U.S.C. 154(b) by 132 days.

(21) Appl. No.: 11/089,312

(22) Filed: Mar. 24, 2005

(65) Prior Publication Data

US 2006/0105551 A1    May 18, 2006

(30) Foreign Application Priority Data

Nov. 15, 2004   (TW) ............................... 93134997 A

(51) Int. Cl.
    *H01L 21/20* (2006.01)
(52) U.S. Cl. ..................... 438/166; 438/487; 438/308; 438/795
(58) Field of Classification Search ................ 438/166, 438/308, 482, 487, 497, 502, 946, 950, 969, 438/795–799; 430/4, 5; 250/492.2
    See application file for complete search history.

(56) References Cited

U.S. PATENT DOCUMENTS

| | | | | |
|---|---|---|---|---|
| 5,547,787 A | * | 8/1996 | Ito et al. ........................ | 430/5 |
| 5,914,202 A | * | 6/1999 | Nguyen et al. ................. | 430/5 |
| 6,451,631 B1 | * | 9/2002 | Grigoropoulos et al. .... | 438/149 |
| 6,803,174 B2 | * | 10/2004 | Jang et al. ................... | 430/321 |
| 6,916,691 B1 | * | 7/2005 | Lai ............................ | 438/149 |
| 7,011,911 B2 | * | 3/2006 | Kim et al. ..................... | 430/5 |
| 2004/0076894 A1 | * | 4/2004 | Hwang .......................... | 430/5 |
| 2004/0224446 A1 | * | 11/2004 | Yeh ............................. | 438/166 |
| 2004/0266146 A1 | * | 12/2004 | Jung .......................... | 438/487 |
| 2005/0059222 A1 | * | 3/2005 | You .......................... | 438/486 |
| 2005/0139788 A1 | * | 6/2005 | You ...................... | 250/492.22 |
| 2005/0142897 A1 | * | 6/2005 | Kim et al. .................. | 438/795 |
| 2006/0177974 A1 | * | 8/2006 | Tanabe ........................ | 438/166 |

FOREIGN PATENT DOCUMENTS

CN          1501437          6/2004

* cited by examiner

*Primary Examiner*—Savitri Mulpuri
(74) *Attorney, Agent, or Firm*—Thomas, Kayden, Horstemeyer & Risley

(57) ABSTRACT

A method of manufacturing a polysilicon layer is provided. Firstly, a substrate is provided. Next, an amorphous silicon having a first region and a second region is formed on the substrate. After that, the amorphous silicon layer in the first region is completely melted and the amorphous silicon layer in the second region is preheated. The completely melted amorphous silicon layer in the first region is crystallized to form a first polysilicon layer. Next, the preheated amorphous silicon layer in the second region is completely melted. The completely melted amorphous silicon layer in the second region is crystallized to form a second polysilicon layer.

9 Claims, 6 Drawing Sheets

METHOD OF MANUFACTURING A POLYSILICON LAYER AND A MASK USED THEREIN

This application claims the benefit of Taiwan application Serial No. 93134997, filed Nov. 15, 2004, the subject matter of which is incorporated herein by reference.

BACKGROUND OF THE INVENTION

1. Field of the Invention

The invention relates in general to a method of manufacturing a polysilicon layer, and more particularly to a method of manufacturing a polysilicon layer using a mask for the laser beam to preheat an amorphous silicon layer and completely melt the preheated amorphous silicon layer, and the mask therein.

2. Description of the Related Art

With the rapid development in science and technology, display panel has been widely used in electronic devices such as notebook, personal digital assistant (PDA) and mobile phone. The display panel has two categories, namely, the amorphous silicon (a-Si) thin film transistor (TFT) display panel and the low temperature polysilicon (LTPS) TFT display panel. The main difference between the LTPS TFT display panel and the amorphous silicon TFT display panel is that the LTPS TFT display panel converts an amorphous silicon layer into a polysilicon layer via laser annealing, largely enhancing the electron mobility of the TFT. The panel driving circuit and the integrated circuit (IC) can be integrated into the LTPS TFT display panel without having extra circuit board design, largely increasing the flexibility in the design of panel and circuit. Therefore, the LTPS TFT display panel is a display panel with great potential.

Referring to FIGS. 1A~1C, flowchart diagrams of a conventional method of manufacturing a polysilicon layer are shown. Firstly, the method begins at FIG. 1A: a substrate is provided 11 and an amorphous silicon layer is formed 12 on the substrate 11. Next, a mask 15 having a non-transparent region 15a and a transparent region 15c is provided atop of the amorphous silicon layer 12, and a laser beam 16 is projected onto the mask 15. Next, as shown in FIG. 1B, the laser beam 16 penetrates through the transparent region 15c and completely melts part of the amorphous silicon layer 12 for the melted amorphous silicon layer 12b and the remaining amorphous silicon layer 12a to be formed on the substrate 11. Since temperature gradient exists between the remaining amorphous silicon layer 12a and the melted amorphous silicon layer 12b, the temperature of the melted amorphous silicon layer 12b is higher than the temperature of the remaining amorphous silicon layer 12a, enabling the melted amorphous silicon layer 12b to use the remaining amorphous silicon layer 12a as seed crystal to laterally form crystallization and become a polysilicon layer 13 along the direction of the arrows 20a and 20b as shown in FIG. 1C. The technology, which uses a laser beam 16 to penetrate through a mask 15 having a non-transparent region 15a and a transparent region 15c to completely melt part of the polysilicon layer 12 for the polysilicon layer 12 to form crystallization laterally, is called the sequence lateral solidification (SLS) method or the excimer laser annealed lateral crystallization (ELA-LC) method. In FIG. 1C, the polysilicon layer 13 has a crystal lattice or boundary 13b. Furthermore, the polysilicon layer 13 corresponds to a defect 13a projected from the surface of the crystal lattice or boundary 13b, affecting the adhesiveness between the insulation layer and the polysilicon layer 13 afterwards.

The distance of lateral crystallization can be enlarged by prolonging laser pulse duration time or by heating the substrate 11 to prolong the silicon melting time. However, according to conventional practice, the manufacturing facility must have a substrate heater to heat the overall piece of the substrate 11. In order to have optimum energy for the temperature gradient and the laser beam 16 to melt the amorphous silicon layer 12, the method of heating the overall piece of the substrate 11 would increase the optimum energy, largely shortening the lifespan and the maintenance period of the laser beam optical module. Besides, the polysilicon layer 13 formed according to the laser annealing method have a large number of defects 13a existing on the crystal lattice or boundary 13b. Although the defects 13a can be repaired by using the laser beam 16 again or using high-temperature treatment, additional manufacturing steps and manufacturing costs would occur. Besides, only part of the laser beam 16 would penetrate through the transparent region 15c and melt part of the amorphous silicon layer 12, so another part of the laser beam 16 would be partly reflected and absorbed by the non-transparent region 15a and converted into heat, resulting in a poor utilization rate of the laser beam 16.

SUMMARY OF THE INVENTION

It is therefore an object of the invention to provide a method of manufacturing a polysilicon layer and a mask used in the method. The design of having a semi-transparent region disposed on the mask for the amorphous silicon layer to be preheated has the advantages of enabling the amorphous silicon to reach melting point earlier, reducing the usage of laser beam, and prolonging the lifespan and the maintenance period of the laser beam optical module. Besides, the present embodiment can prolong silicon melting time and increase the distance of lateral crystallization and the manufacturing range of crystallization. Besides, the present embodiment can repair the defects on the polysilicon layer and increase the utilization rate of the laser beam.

According to the above-identified object of the invention, a method of manufacturing a polysilicon layer is provided. Firstly, a substrate is provided. Next, an amorphous silicon having a first region and a second region is formed on the substrate. After that, the amorphous silicon layer in the first region is completely melted and the amorphous silicon layer in the second region is preheated. The completely melted amorphous silicon layer in the first region is crystallized to form a first polysilicon layer. Next, the preheated amorphous silicon layer in the second region is completely melted. The completely melted amorphous silicon layer in the second region is crystallized to form a second polysilicon layer.

According to the above-identified objects of the invention, a mask for a laser beam to preheat and melt an amorphous silicon layer disposed on a substrate is provided. The mask comprises a mask body, a number of first patterns and a number of second patterns. The first patterns are formed on the mask body with each of the first patterns being separated from and parallel to each other. Each of the first patterns has a first transparent region and a first semi-transparent region. The first patterns are for the laser beam to preheat and completely melt a part of the amorphous silicon layer for crystallizing the completely melted part of the amorphous silicon layer to form a first polysilicon layer. The second pattern are formed on the mask body with each of the second patterns being separated from and parallel to each other. The second patterns are separated from and parallel to the first patterns. The second patterns and the first patterns are alternately arranged. Each of the second patterns has a second transparent region and a second semi-transparent region. The second semi-transparent regions are positioned between the second transparent region and the first transparent regions. The second patterns are for the laser beam to preheat and completely melt another part of the amorphous silicon layer for crystallizing the another completely melted part of the amorphous silicon layer to form a second polysilicon layer.

Other objects, features, and advantages of the invention will become apparent from the following detailed description of the preferred but non-limiting embodiments. The following description is made with reference to the accompanying drawings.

DETAILED DESCRIPTION OF THE INVENTION

FIRST EMBODIMENT

Figure 1A:
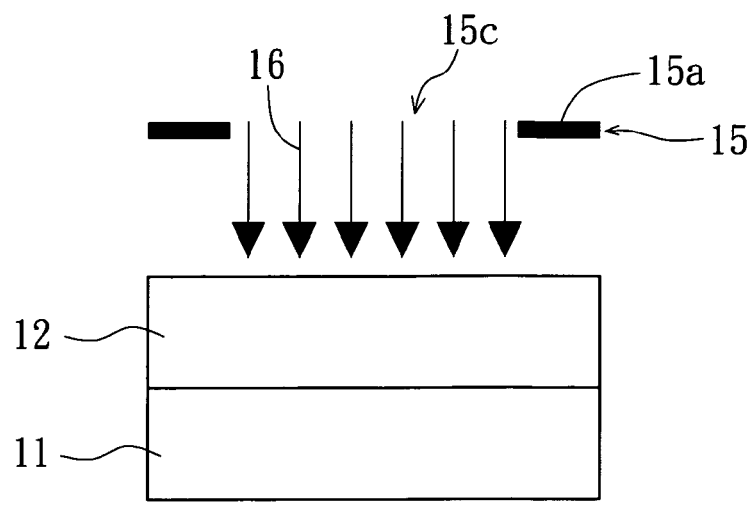
FIGS. 1A~1C are flowchart diagrams of a conventional method of manufacturing a polysilicon layer.
Figure 1B:
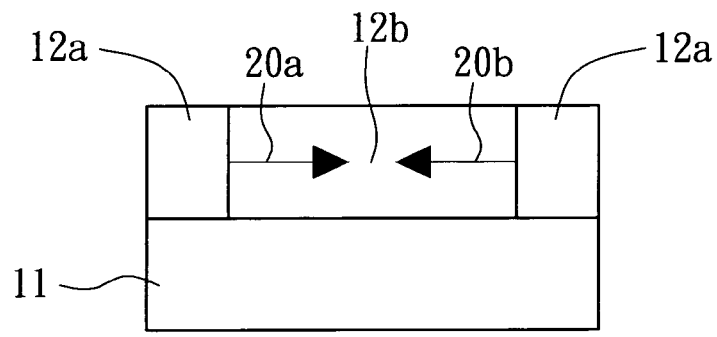
Figure 1C:
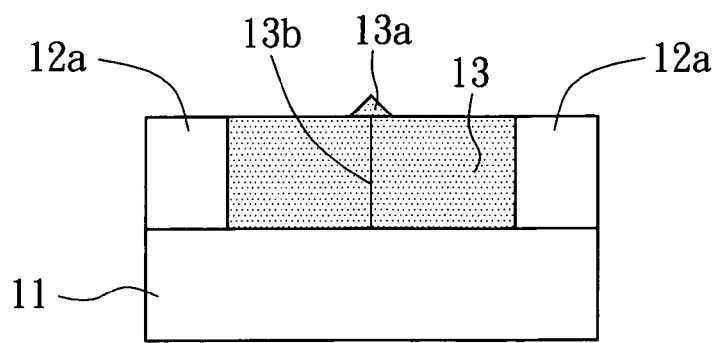
Figure 2:
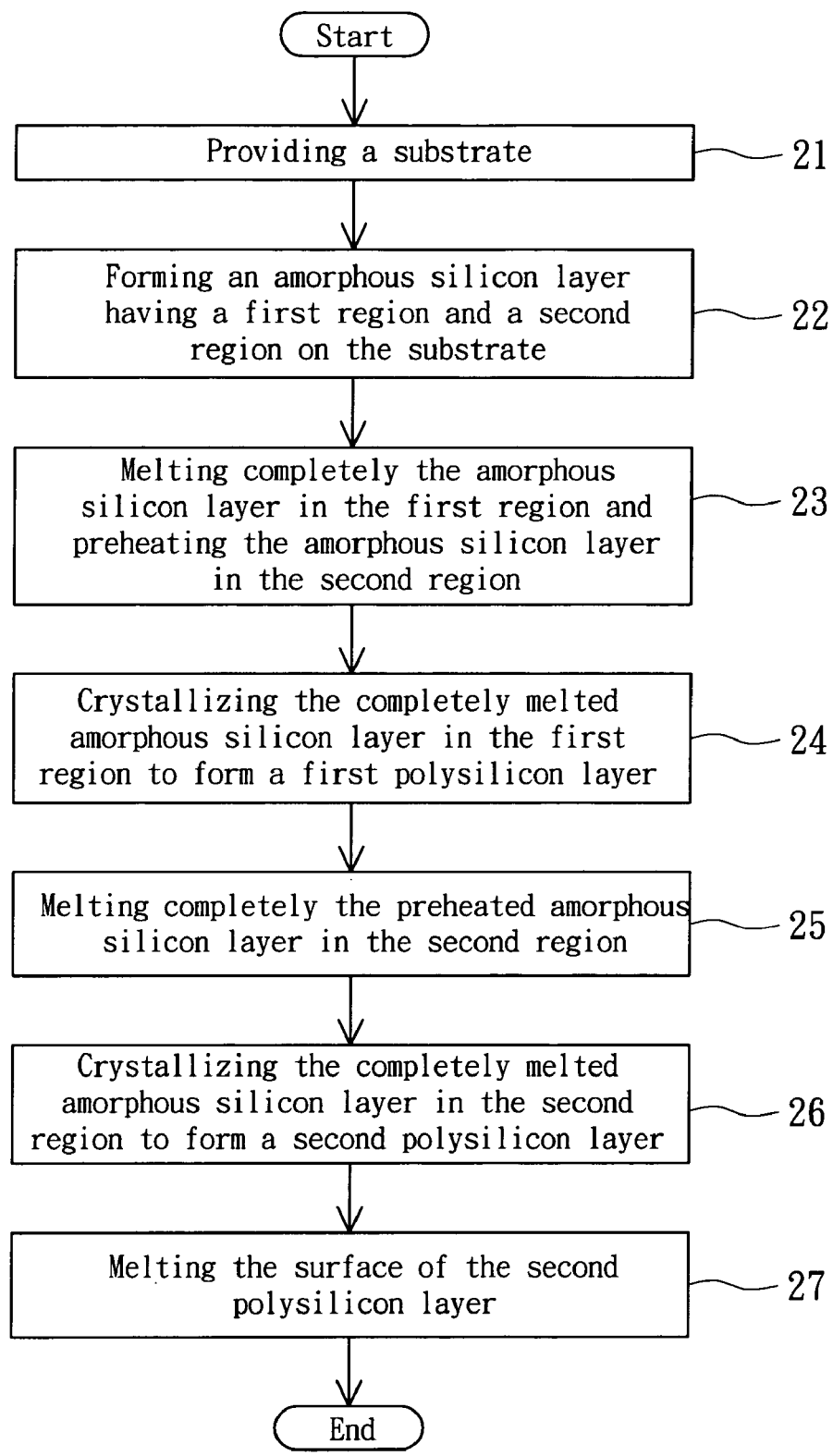
FIG. 2 is a flowchart diagram of a method of manufacturing a polysilicon layer according to a first embodiment of the invention.
Figure 3A:
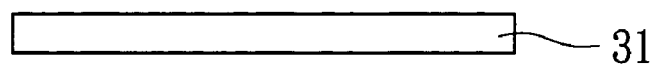
FIGS. 3A~3E are flowchart diagrams of a method of manufacturing a polysilicon layer according to a first embodiment of the invention.
Figure 3B:
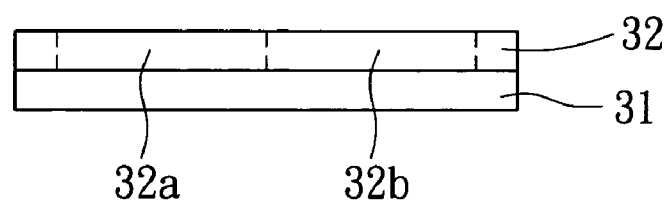
Figure 3C:
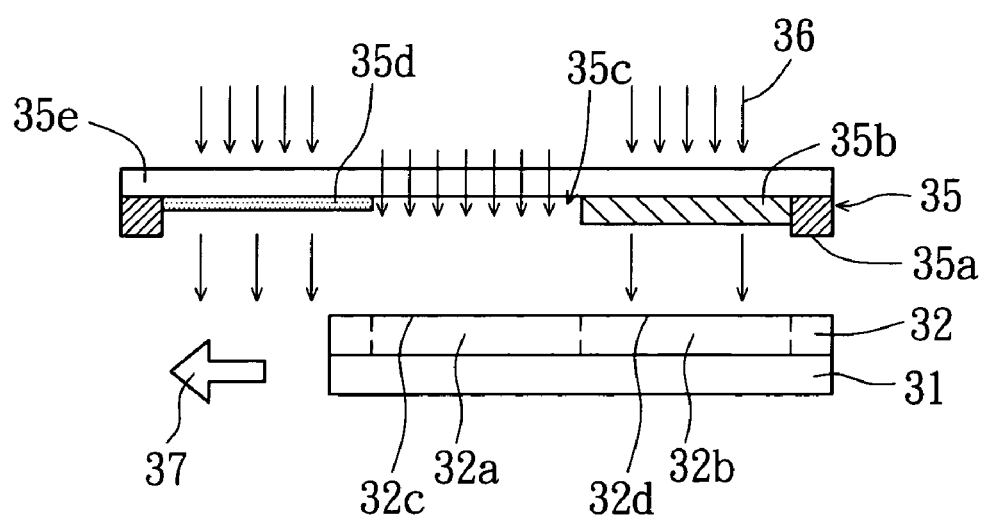
Figure 3D:
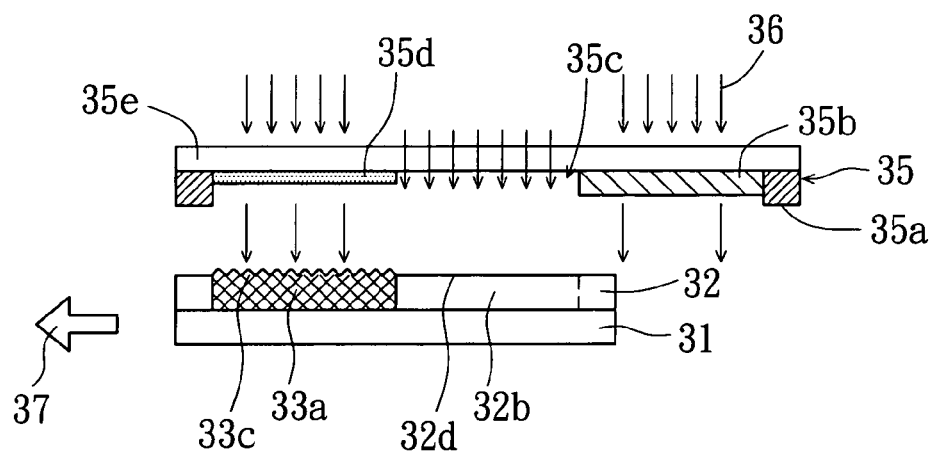

Referring to FIGS. 2 and 3A~3E, wherein FIG. 2 is a flowchart diagram of a method of manufacturing a polysilicon layer according to a first embodiment of the invention, while FIGS. 3A~3E are flowchart diagrams of a method of manufacturing a polysilicon layer according to a first embodiment of the invention. Firstly, the method begins at step 21: a substrate 21 is provided as shown in FIG. 3A. Next, proceed to the step 22 of FIG. 2: an amorphous silicon layer 32 having a first region 32a and a second region 32b is formed on the substrate 31 as shown in FIG. 3B. After that, proceed to step 23: the amorphous silicon layer 32 in the first region 32a is completely melted and the amorphous silicon layer 32 in the second region 32b is preheated as shown in FIG. 3C. Then, proceed to step 24: the completely melted amorphous silicon layer in first region 32a is crystallized to form a first polysilicon layer 33a as shown in FIG. 3D.

To achieve the object of completely melting the amorphous layer 32 in the first region 32a and preheating the amorphous layer 32 in the second region 32b, firstly, a mask 35 is provided. The mask 35 can move above the substrate 31 and the amorphous layer 32, or the substrate 31 and the amorphous layer 32 can move underneath the mask 35 as shown in FIGS. 3C~3D. The mask 35 has a mask body 35e, a non-transparent region 35a, a first semi-transparent region 35b, a transparent region 35c and a second semi-transparent region 35d. The non-transparent region 35a, the first semi-transparent region 35b, the transparent region 35c and the second semi-transparent region 35d are formed on the mask body 35e. The transparent region 35c can connect the first semi-transparent region 35b and the second semi-transparent region 35d. Besides, the mask body 35e can be a transparent quartz substrate, the transparent region 35c can be an aperture region, a slit or a transparent region for instance. The light transmission rate of the second semi-transparent region 35d can be higher than that of the first semi-transparent region 35b. The first semi-transparent region 35b comprises a metallic layer, a semiconductor layer, an insulation layer, or an organic layer and any combination thereof. The second semi-transparent region 35d comprises a metallic layer, a semiconductor layer, an insulation layer, or an organic layer and any combination thereof. The metallic layer can be made of chromium (Cr) or molybdenum (Mo), the semiconductor layer can be made of polysilicon, the insulation layer can be made of silicon oxide (SiO), silicon nitride (SiN) or silicon oxynitride (SiNO). Besides, the first semi-transparent region 35b and the second semi-transparent region 35d can be made of any material that can partly cover up or totally resist the light source. When the first semi-transparent region 35b and the second semi-transparent region 35d are both metals, chromium (Cr) or molybdenum (Mo) for instance, within a certain range of thickness such as 1~50 nm, the light transmission rate is inversely proportional to the thickness.

In FIG. 3C, the transparent region 35c and the first semi-transparent region 35b correspond to the surface 32c of the amorphous silicon layer 32 in the first region 32a and the surface 32d of the amorphous silicon layer 32 in the second region 32b. That is to say, the transparent region 35c and the first semi-transparent region 35b are respectively positioned atop of the surface 32c of the amorphous silicon layer 32 in the first region 32a and the surface 32d of the amorphous silicon layer 32 in the second region 32b. Furthermore, the area of the transparent region 35c and the area of the first semi-transparent region 35b must correspond to the area of the surface 32c of the amorphous silicon layer 32 in the first region 32a and the area of the surface 32d of the amorphous silicon layer 32 in the second region 32b. Next, a laser beam 36 is projected onto the mask 35. The laser beam 36 can directly penetrate through the transparent region 35c to be projected onto the surface 32c of the amorphous silicon layer 32 in the first region 32a. Since the first semi-transparent region 35b would absorb and reflect part of the laser beam 36, the laser beam 36 partly penetrates through the first semi-transparent region 35b to be projected onto the surface 32d of the amorphous silicon layer 32 in the second region 32b. After a period of time, the laser beam 36, which directly penetrates through the transparent region 35c, would completely melt the amorphous silicon layer 32 in the first region 32a, but the laser beam 36, which only partly penetrates through the first semi-transparent region 35b, only preheats the amorphous silicon layer 32 in the second region 32b without melting the amorphous silicon layer 32 in the second region 32b. When the amorphous silicon layer 32 in the first region 32a is completely melted and the amorphous silicon layer 32 in the second region 32b is preheated not melted, the projection of the laser beam 36 is stopped. Meanwhile, the completely melted amorphous silicon layer in first region 32a is laterally crystallized to form a first polysilicon layer 33a. However, the surface 33c of the first polysilicon layer 33a is uneven due to the defects on crystal lattice or crystal boundary, while the amorphous silicon layer 32 in the second region 32b absorbs part of the heat of the laser beam 36 and remains at preheating state.

After the first polysilicon 33a is formed and the second region 32b is preheated in the FIG. 3D, proceed to the step 25 in FIG. 2: the preheated amorphous silicon layer in the second region 32b is completely melted and the surface 33c of the first polysilicon layer 33a is melted. Then, proceed to step 26: the completely melted amorphous silicon layer in the second region 32b is crystallized to form a second polysilicon layer 33b and the melted surface 33c of the first polysilicon layer 33a is recrystallized to repair the defects on the crystal lattice or boundary and smooth the surface 33c of the first polysilicon layer 33a. In step 25, firstly, a mask 35 and a substrate 31 of FIG. 3C are selectively moved. For example, the mask 35 is fixed but the substrate 31 is moved along the direction of the arrow 37 in FIG. 3C for the transparent region 35c and the second semi-transparent region 35d to respectively correspond to the preheated surface 32d of the preheated amorphous silicon layer in the second region 32b and the surface 33c of the first polysilicon layer 33a as shown in FIG. 3D. That is to say, the transparent region 35c and the second semi-transparent region 35d are respectively positioned atop of the preheated surface 32d of the preheated amorphous silicon layer in the second region 32b and the surface 33c of the first polysilicon layer 33a. Furthermore, the area of the transparent region 35c and the area of the second semi-transparent region 35d must correspond to the area of the surface 32d of the amorphous silicon layer 32 in the second region 32b and the area of the surface 33c of the first polysilicon layer 33a. Next, the laser beam 36 is projected onto the mask 35 again. The laser beam 36, which penetrates through the transparent region 35c and completely melts the preheated second region 32b, partly penetrates through the semi-transparent region 35d and melts the surface 33c of the first polysilicon layer 33a without half or completely melting the first polysilicon layer 33a. Meanwhile, the completely melted amorphous silicon layer in the second region 32b is crystallized to form a second polysilicon layer 33b. However, the surface 33d of the second polysilicon layer 33 becomes uneven due to the defects on crystal lattice or crystal boundary, while the melted surface 33c of the first polysilicon layer 33a is recrystallized and becomes even smoother.

Figure 3E:
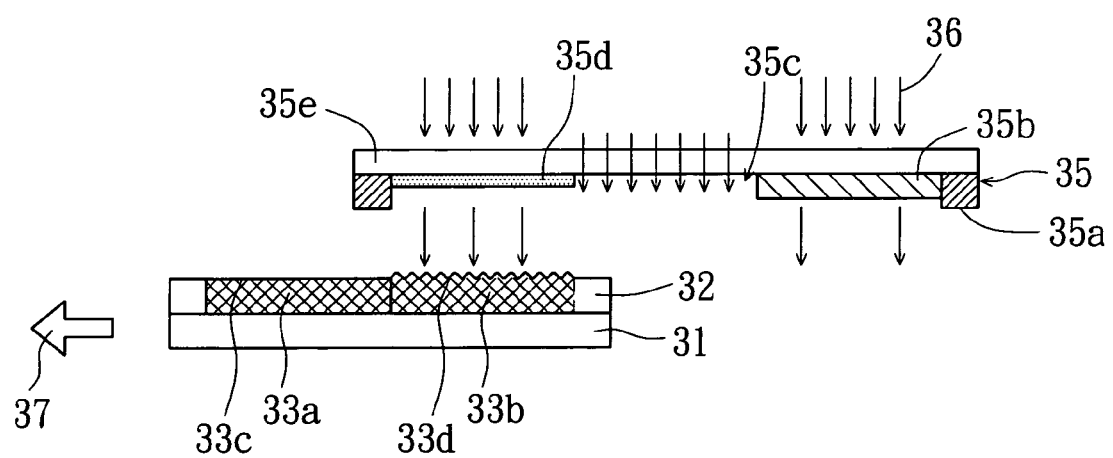

After the second polysilicon layer 33b is formed, proceed to the step 27 of FIG. 2: the surface 33d of the second polysilicon layer 33b is melted. Then, the melted surface 33d of the second polysilicon layer 33b is recrystallized to repair the defects on the crystal lattice or boundary. In the step 27, firstly, the mask 35 and the substrate 31 of FIG. 3D are selectively moved. For example, the mask 35 is fixed but the substrate 31 is moved along the direction of the arrow 37 in FIG. 3D for the second semi-transparent region 35d to correspond to the surface 33d of the second polysilicon layer 33b as shown in FIG. 3E. That is to say, the second semi-transparent region 35d is positioned atop of the surface 33d of the second polysilicon layer 33b. Furthermore, the area of the second semi-transparent region 35d corresponds to the area of the surface 33d of the second polysilicon layer 33b. Next, the laser beam 36 is projected onto the mask 35 again. The laser beam 36 partly penetrates through the semi-transparent region 35d and melts the surface 33d of the second polysilicon layer 33b without half or completely melting the second polysilicon layer 33b. Meanwhile, the melted surface 33d of the second polysilicon layer 33b is recrystallized and becomes even smoother. After that, the mask 35 and the substrate 31 of FIG. 3E are selectively moved. For example, the mask 35 is fixed but the substrate 31 is moved along the direction of the arrow 37 in FIG. 3E for the mask 35 be away from the first polysilicon layer 33a and the second polysilicon layer 33b, both of which are disposed on the substrate 31, then continue the step of preheating and completely melting other regions.

Figure 4:
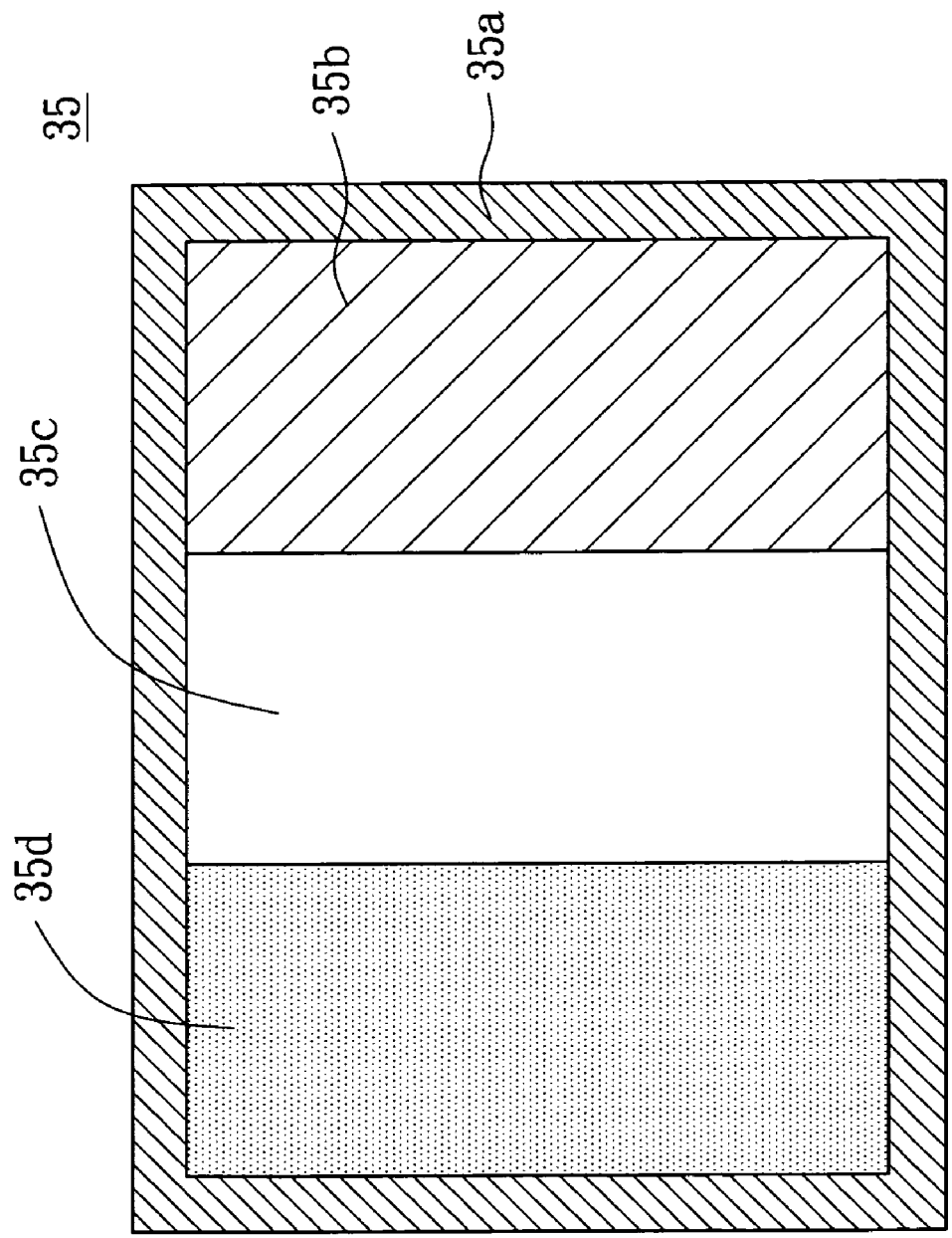
FIG. 4 is a top view of a mask for the laser beam to preheat and melt an amorphous silicon layer according to a first embodiment of the invention.

Referring to FIG. 4, a top view of a mask for the laser beam to preheat and melt an amorphous silicon layer according to a first embodiment of the invention is shown. In FIG. 4, a mask 35 at least having a non-transparent region 35a, a first semi-transparent region 35b, a transparent region 35c and a second semi-transparent region 35d, a non-transparent region 35a is provided. The first semi-transparent region 35b, the transparent region 35c and the second semi-transparent region 35d are all formed on a mask body 35e of FIGS. 3C~3E.

However, anyone who is skilled in the art would understand that the technology of the present embodiment is not limited thereto. For example, after the second polysilicon layer 33b is formed, the present embodiment can use a mask having a semi-transparent region for a laser beam 36 to melt the surface 33c of the first polysilicon layer 33a and the surface 33d of the second polysilicon layer 33b for the melted surface 33c of the first polysilicon layer 33a and the melted surface 33d of the second polysilicon layer 33b to be recrystallized to repair the defects on the crystal lattice or boundary, and for the surface 33c of the first polysilicon layer 33a and the surface 33d of the second polysilicon layer 33b to become even smoother. Besides, in response to the distributed area of the amorphous silicon layer, the mask of the present embodiment has the design of a number of transparent regions and a number of first semi-transparent regions. The transparent regions and the first semi-transparent regions, which are alternately arranged, are connected together to form a column, a row or an array. When the mask and the substrate are moved relatively, the object of using the laser beam to preheat amorphous silicon layer and completely melt the preheated amorphous silicon layer can be achieved, not only reducing manufacturing time but also largely improving manufacturing efficiency.

SECOND EMBODIMENT

Figure 5:
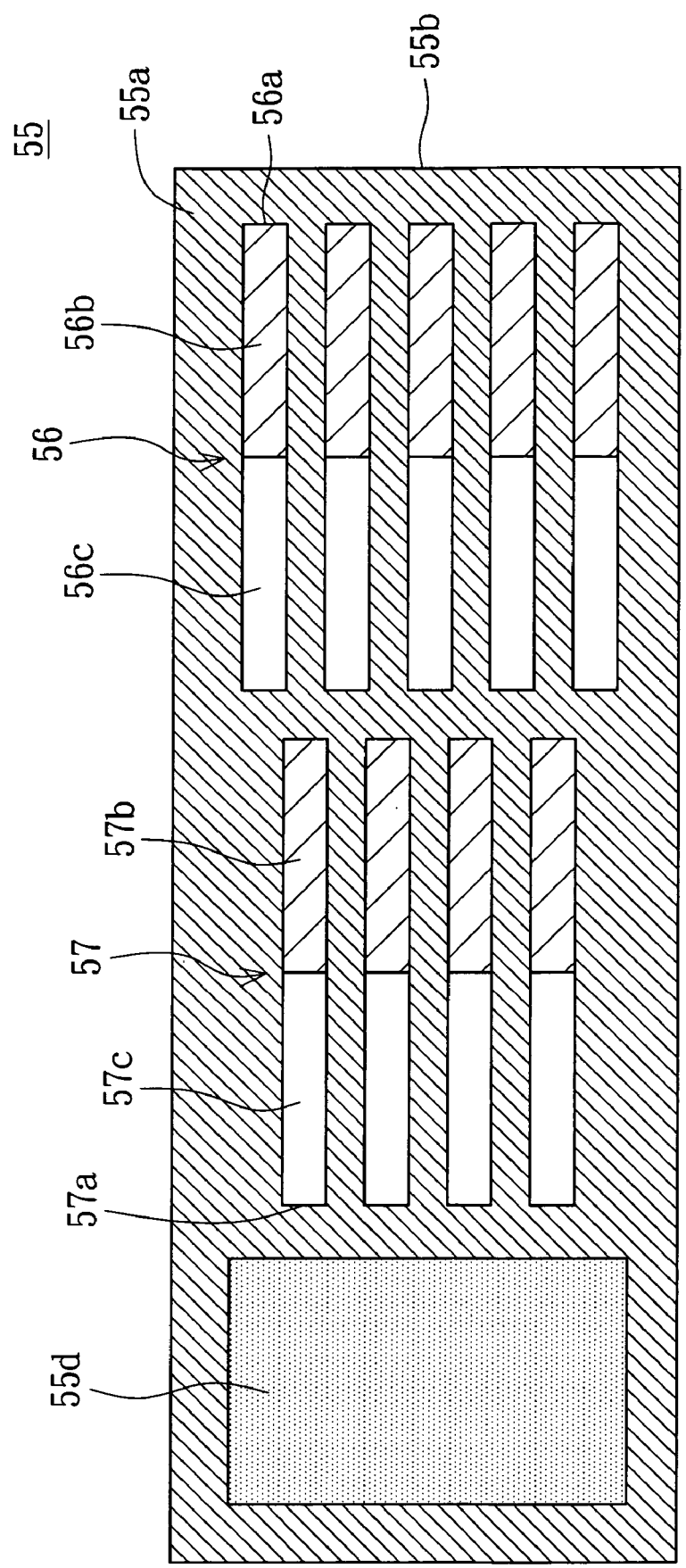
FIG. 5 is a top view of a mask for the laser beam to preheat and melt an amorphous silicon layer according to a second embodiment of the invention.

Referring to FIG. 5, a top view of a mask for the laser beam to preheat and melt an amorphous silicon layer according to a second embodiment of the invention is shown. In FIG. 5, a mask 55 is used for a laser beam to preheat and melt an amorphous silicon layer disposed on a substrate. The amorphous silicon layer has a first region and a second region, while the mask 55 is moved relatively to the substrate. The technology of forming an amorphous silicon layer on the substrate and moving a mask relatively to the substrate are disclosed in the first embodiment and is not repeated in the present embodiment again. The mask 55 comprises a mask body 55b, a non-transparent region 55a, a first mask pattern 56, a second mask pattern 57 and a semi-transparent region 55d. The non-transparent region 55a is formed on the mask body 55b. The first mask pattern 56, the second mask pattern 57 and the semi-transparent region 55d are mutually separated and formed on the mask body 55b. The second mask pattern 57 is positioned between the first mask pattern 56 and the semi-transparent region 55d. The mask body 55b can be a transparent quartz substrate.

The first mask pattern 56 has plural rows of mutually separated first patterns 56a, the second mask pattern 57 has plural rows of second patterns 57a which are mutually separated and are parallel to the first patterns 56a. The first patterns 56a and the second patterns 57a are alternately arranged on the mask body 55b. In the present embodiment, the first patterns 56a and the second patterns 57a are exemplified by strip patterns. Besides, each of the first patterns 56a has a first semi-transparent region 56b and a first transparent region 56c. The first transparent region 56c is positioned between the first semi-transparent region 56b and the semi-transparent region 55d. Each of the second patterns 57a has a second semi-transparent region 57b and a second transparent region 57c. The second transparent region 57c is positioned between the second semi-transparent region 57b and the semi-transparent region 55d. Besides, the light transmission rates of the first semi-transparent regions 56b and the second semi-transparent regions 57b are lower than that of the semi-transparent region 55d.

When the mask is moved from the left to the right on the amorphous silicon layer, the first mask pattern 56 is used to preheat and completely melt the remaining part of the amorphous silicon which has not been preheated and completely melted by the second mask pattern 57, so the object of preheating and completely melting the overall piece of the amorphous silicon layer can be achieved Firstly, the first semi-transparent regions 56b and the second semi-transparent regions 57b respectively correspond to the amorphous silicon layer in the second region for the laser beam to partly penetrate through and preheat the amorphous silicon layer in the second region. The first transparent regions 56c and the second transparent regions 57c correspond to the amorphous silicon layer in the first region when the first semi-transparent regions 56b and the second semi-transparent regions 57b respectively correspond to the second region for the laser beam to penetrate through and completely melt the amorphous silicon layer in the first region, so that the completely melted amorphous silicon layer in the first region is crystallized to form a first polysilicon layer.

Next, after the first polysilicon layer is formed and the amorphous silicon layer in the second region is preheated, the mask 55 and the substrate are selectively moved for the first transparent regions 56c and the second transparent regions 57c and the semi-transparent region 55d to respectively correspond to the preheated second region and the first polysilicon layer. Meanwhile, the laser beam penetrates through the first transparent regions 56c and the second transparent regions 57c and completely melts the preheated amorphous silicon layer in the second region. Furthermore, the completely melted amorphous silicon layer in the second region is crystallized to form a second polysilicon layer. The laser beam penetrates through the semi-transparent region 55d to melt the surface of the first polysilicon layer. Then, the melted surface of the first polysilicon layer is recrystallized to repair the defects on crystal lattice or boundary and for the surface of the first polysilicon layer to become even smoother.

After that, when the melted surface of the first polysilicon layer is recrystallized, the mask 55 and the substrate are selectively moved for the semi-transparent region 55d to correspond to the second polysilicon layer. The laser beam partly penetrates through the semi-transparent region 55d and melts the surface of the second polysilicon layer. Then, the melted surface of the second polysilicon layer is recrystallized to repair the defects on crystal lattice or boundary and for the surface of the second polysilicon layer to become even smoother.

Therefore, the first patterns 56a are for the laser beam to preheat and completely melt part of the amorphous silicon layer for the completely melted part of the amorphous silicon layer to form crystallization and become a first polysilicon layer. The second patterns 57a are for the laser beam to preheat and completely melt another part of the amorphous silicon layer for another part of the completely melted amorphous silicon layer to form crystallization and become a second polysilicon layer. The semi-transparent region 55d is for the laser beam to partly penetrate through and melt the first polysilicon layer and the surface of the second polysilicon layer for the melted first polysilicon layer and the surface of the second polysilicon layer to be recrystallized. Each of the first semi-transparent regions 56b and the second semi-transparent regions 57b comprises a metallic layer, a semiconductor layer, an insulation layer, or an organic layer and any combination thereof. The semi-transparent region 55d also comprises a metallic layer, a semiconductor layer, an insulation layer, or an organic layer and any combination thereof. The metallic layer can be made of chromium (Cr) or molybdenum (Mo), the semiconductor layer can be made of polysilicon, the insulation layer can be made of silicon oxide (SiO), silicon nitride (SiN) or silicon oxynitride (SiNO). Besides, the first semi-transparent regions 56b, the second semi-transparent regions 57b and the semi-transparent region 55d can be made of any material that can partly cover up or totally resist the light source. When each of the first semi-transparent regions 56b, each of the first semi-transparent regions 57b and the semi-transparent region 55d are all chromium (Cr) or molybdenum (Mo), the light transmission rate of the semi-transparent region 55d can be higher than that of each the first semi-transparent regions 56b and each the second semi-transparent region 57b.

In the method of manufacturing a polysilicon layer disclosed in the above embodiment of the invention, the design of having a semi-transparent region disposed on the mask for the amorphous silicon layer to be preheated has the advantages of enabling the amorphous silicon to reach melting point earlier, reducing the usage of laser beam, and prolonging the lifespan and the maintenance period of the laser beam optical module. Besides, the present embodiment can prolong silicon melting time and increase the distance of lateral crystallization and the manufacturing range of crystallization. Besides, the present embodiment can repair the defects on the polysilicon layer and increase the utilization rate of the laser beam.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a polysilicon layer, comprising:
    providing a substrate;
    forming an amorphous silicon layer having a first region and a second region on the substrate;
    melting completely the amorphous silicon layer in the first region and preheating the amorphous silicon layer in the second region;
    crystallizing the completely melted amorphous silicon layer in the first region to form a first polysilicon layer;
    melting completely the preheated amorphous silicon layer in the second region; and
    crystallizing the completely melted amorphous silicon layer in the second region to form a second polysilicon layer, wherein the step of melting completely the amorphous silicon layer in the first region and preheating the amorphous silicon layer in the second region comprises:

providing a mask having a first semi-transparent region and a transparent region, wherein the first semi-transparent region and the transparent region correspond to the surface of the amorphous silicon layer in the second region and the surface of the amorphous silicon layer in the first region, respectively; and projecting a laser beam onto the mask, wherein the laser beam penetrates through the transparent region and partly penetrates through the first semi-transparent region.

2. The method according to claim 1, further comprising:
melting the surface of the first polysilicon layer; and
recrystallizing the melted surface of the first polysilicon layer.

3. The method according to claim 1, further comprising:
melting the surface of the second polysilicon layer; and
recrystallizing the melted surface of the second polysilicon layer.

4. The method according to claim 1, further comprising:
melting the surface of the first polysilicon layer and the surface of the second polysilicon layer; and
recrystallizing the melted surface of the first polysilicon layer and the melted surface of the second polysilicon layer.

5. The method according to claim 1, wherein the step of melting completely the preheated amorphous silicon layer in the second region comprises:

selectively moving the mask and the substrate so that the transparent region corresponds to the surface of the preheated amorphous silicon layer in the second region; and projecting the laser beam onto the mask, wherein the laser beam penetrates through the transparent region.

6. The method according to claim 1, wherein the step of melting completely the preheated amorphous silicon layer in the second region comprises:

providing a mask having a transparent region, wherein the transparent region corresponds to the surface of the preheated amorphous silicon layer in the second region;

projecting a laser beam onto the mask, wherein the laser beam penetrates through the transparent region; and melting completely the preheated amorphous silicon layer in the second region.

7. The method according to claim 1, further comprising:

providing a mask having a semi-transparent region, wherein the semi-transparent region corresponds to the surface of the first polysilicon layer;

projecting a laser beam onto the mask, wherein the laser beam partly penetrates through the semi-transparent region;

melting the surface of the first polysilicon layer; and recrystallizing the melted surface of the first polysilicon layer.

8. The method according to claim 1, further comprising:

providing a mask having a semi-transparent region, wherein the semi-transparent region corresponds to the surface of the second polysilicon layer;

projecting a laser beam onto the mask, wherein the laser beam partly penetrates through the semi-transparent region;

melting the surface of the second polysilicon layer; and recrystallizing the melted surface of the second polysilicon layer.

9. The method according to claim 1, further comprising:

providing a mask having a semi-transparent region, wherein the semi-transparent region corresponds to the surface of the first polysilicon layer and the surface of the second polysilicon layer;

projecting a laser beam onto the mask, wherein the laser beam partly penetrates through the semi-transparent region;

melting the surface of the first polysilicon layer and the surface of the second polysilicon layer; and recrystallizing the melted surface of the first polysilicon layer and the melted surface of the second polysilicon layer.

* * * * *